United States Patent
Strope et al.

[11] Patent Number: 5,309,542
[45] Date of Patent: May 3, 1994

[54] FIBER OPTIC TRANSMITTER MODIFICATION FOR IMPROVED EXTINCTION RATIO

[75] Inventors: Douglas H. Strope, Apalachin; Lawrence P. Brehm, Binghamton; Kishen N. Kapur, Vestal; Robert C. Seward, Endicott, all of N.Y.

[73] Assignee: International Business Machines Corporation, Armonk, N.Y.

[21] Appl. No.: 764,569

[22] Filed: Sep. 18, 1991
(Under 37 CFR 1.47)

[51] Int. Cl.$^5$ .......................... G02B 6/00; G02B 6/36
[52] U.S. Cl. ..................................... 385/140; 359/41; 355/1
[58] Field of Search .................. 385/33, 43, 104; 359/41, 51; 355/1, 46

[56] References Cited

U.S. PATENT DOCUMENTS

| | | | |
|---|---|---|---|
| H491 | 7/1988 | Pitruzzello et al. | 385/140 |
| 4,316,665 | 2/1982 | Mochizuki et al. | 355/1 |
| 4,372,644 | 2/1983 | Unger | 350/96.20 |
| 4,427,261 | 1/1984 | Khoe et al. | 350/96.20 |
| 4,768,853 | 9/1988 | Bhagavatula | 350/96.15 |
| 4,783,137 | 11/1988 | Kosman et al. | 350/96.16 |
| 4,792,202 | 12/1988 | Zucker et al. | 350/96.29 |
| 4,799,234 | 1/1989 | Haeussler et al. | 372/97 |
| 4,807,954 | 2/1989 | Oyahada et al. | 385/33 X |
| 5,011,265 | 4/1991 | Tamamura et al. | 359/629 |
| 5,015,057 | 5/1991 | Rumbaugh et al. | 359/41 |

*Primary Examiner*—Akm E. Ullah
*Attorney, Agent, or Firm*—Calfee Halter & Griswold

[57] ABSTRACT

A fiber optic data transmission system and method are provided comprising a laser diode, an attenuating and focusing lens, and an optical fiber. The method of operating the system attenuates laser diode radiation outputted during operation. The system operates by application of the input driving current to the laser diode in a manner which increases the laser diode extinction ratio. The increased laser diode power output associated with operation at a higher extinction ratio is attenuated by the lens to a safe operating level. Increasing the laser diode extinction ratio significantly increases the system's signal-to-noise ratio and thereby reduces the bit error rate associated with the data transmitted over the optical fiber, while the attenuation of the laser diode output radiation allows operation within prescribed safety limits.

20 Claims, 3 Drawing Sheets

FIBER OPTIC TRANSMITTER MODIFICATION FOR IMPROVED EXTINCTION RATIO

Technical Field

The present invention relates generally to a device and method for transmitting data over optical fibers and more specifically to a device and method for transmitting the output of a semiconductor laser over an optical fiber. The device includes a laser diode, means for optically focusing and attenuating the output of the laser diode, and optical fiber transmission means. The method increases the signal-to-noise and extinction ratios of the laser diode during operation while attenuating the resulting increased power output to a safe level of operation.

BACKGROUND

Fiber optic data transmission systems or links are used in certain telecommunications networks to transmit data over optical fibers between digital electronic devices. A fiber optic link offers many advantages over conventional electrical cable transmission of data, including faster transmission rates, increased information carrying capability, longer link distance, and lower cost. Typically these data transmission systems comprise a fiber optic transmitter such as a solid state light-emitting device, and an optical fiber for carrying the digital output of the fiber optic transmitter.

Solid state light-emitting devices commonly used in fiber optic data transmission systems include light-emitting diodes (LEDs) and laser diodes. An LED is a relatively low-power optical source which operates at a lower data transmission rate than does a laser diode due to a spectral output which is not suitable for high speed data transmission. For applications which require high-speed data transmission or which cover long distances, a laser diode is preferred as the optical transmitter. Typically, the full output of the laser diode is applied directly or through a focusing lens to the optical fiber.

The use of a laser diode in combination with an optical fiber, however, introduces a couple of problems. First, a portion of the laser diode output is reflected from the laser diode-optical fiber connection back toward the laser. This back reflection affects the operation of the laser by interfering with, and thus altering, the frequency and amplitude of the laser output oscillations. Second, the increased power associated with using a laser diode as an optical source introduces a concern for the safe operation of the data transmission system. These concerns include potential exposure of the laser output to the eye, particularly if the optical fiber is detachable from the transmitter, and operation of the system within prescribed power output specifications.

Methods are known to minimize laser diode back reflection caused by the laser diode output. A known manner of minimizing back reflection of laser output oscillations in a laser diode-optical fiber transmission system includes inserting an element intermediate the laser diode and the transmission fiber. Examples of such systems are shown in U.S. Pat. Nos. 4,372,644 to Unger and 4,807,954 to Oyamada, et al. Unger discloses a polarizing element intermediate the laser diode and the optical fiber to convert the linearly polarized wave at the laser output to a circularly polarized wave at the optical fiber input. In effect, the polarizing element acts as an isolator for suppressing back reflection of any light for which the polarization state is preserved upon reflection. Oyamada shows a lens element between the laser diode and the optical fiber to reduce the backward coupling efficiency of back reflected light, thereby substantially preventing reflection of the light beam from the fiber back to the laser. Neither Unger nor Oyamada, however, address power output considerations, as neither device shows means to significantly attenuate the output power of the laser diode. Moreover, neither Unger nor Oyamada suggest that an increased laser diode signal-to-noise ratio can be achieved by increasing the drive current supplied to the laser diode.

It is an object, then, of the present invention to provide a fiber optic data transmission system comprising a laser diode transmitter and an optical fiber, having an increased signal-to-noise ratio achieved by operating the laser diode at a higher drive current to increase its extinction ratio.

It is another object of the present invention to provide a laser diode transmitter for use in a fiber optic data transmission system, the optical power radiating from which is within prescribed safety limits.

SUMMARY OF THE INVENTION

A fiber optic data transmission system and method for transmitting data between electronic devices over optical fibers is provided. The system includes a laser diode, a lens for attenuating and focusing the output of the laser diode, and an optical fiber for transmitting data. The rate at which data is transmitted is on the order of 100 megabits per second to 1000 megabits per second or greater. The driving source of the data is the laser diode which produces a stream of binary data which is to be communicated along the optical fiber.

The transmission system comprises an optical transmitter subassembly and a fiber optic cable assembly. The optical transmitter subassembly includes the laser diode and the lens. The fiber optic cable assembly includes the optical fiber which is contained within a ferrule, and means for removably attaching the cable assembly to the fiber optic transmitter subassembly. The complete data transmission system is formed by coupling the fiber optic cable assembly to the optical transmitter subassembly.

The optical transmitter subassembly provides means for carrying an electrical current from an outside source to the laser diode. The laser diode and the lens are housed within the optical transmitter subassembly and are aligned to permit communication of the laser diode output through the lens to an end face of the optical fiber. The lens is made of a partially light-absorptive material which permits the lens to attenuate the output of the laser diode to a safe operating level. The attenuation capability of the lens can be enhanced by coating either or both ends of the lens with a partially light-absorptive material.

The lens has the capability to focus, as well as attenuate, the output of the laser diode. The partially light-absorptive material from which the lens is made has a gradient refractive index induced within it by material impurities. This gradient refractive index permits the lens to focus the output of the laser diode onto the end face of the optical fiber. The end of the lens facing the laser diode can be convex in shape to increase the focusing power of the lens.

The fiber optic cable assembly includes means for removably attaching the assembly to the optical transmitter subassembly. The alignment of the optical fiber with the lens is accomplished by a precise mechanical fit between the outer diameter of the ferrule which contains the fiber, and a bore in the optical transmitter subassembly into which the fiber ferrule is inserted. The optical fiber is thus aligned with and removably attachable to the optical transmitter subassembly.

During operation of the optical data transmission system, the laser diode is supplied with a drive current which determines the amount of power output of the laser diode. The laser diode output is coherent only if a sufficiently high drive current is provided. Because data transmission at high rates over long distances requires a coherent laser output, it is necessary to provide the laser diode with a sufficient level of current to achieve coherence. Moreover, it is desirable to operate the laser diode beyond this level of current to increase the laser diode output power, since this will enhance the data transmission system's signal-to-noise ratio.

However, operating the laser diode at a higher drive current to increase its power output level may cause the system to operate at an unsafe level if the output is supplied directly to the optical fiber. Because the optical fiber is removable from the transmitter, the unattenuated laser diode output may be exposed to the eye. Moreover, typical safety regulations limit the output of the transmitter to a level of order of one milliwatt, and the unattenuated output of the laser diode is in the range of approximately one to five milliwatts.

The laser in the present invention is operated at a high drive current while limiting the output power of the transmitter subassembly to arbitrary but specified limits by the use of the attenuating lens. By providing the laser with a high input current, the laser operates at a lower optical noise level and the laser output will have an increased signal-to-noise ratio. By attenuating the resulting increase in laser diode output power, the average power supplied to the optical fiber through the attentuating lens will be within safety limits.

DETAILED DESCRIPTION OF THE PREFERRED EMBODIMENT

Figure 1:
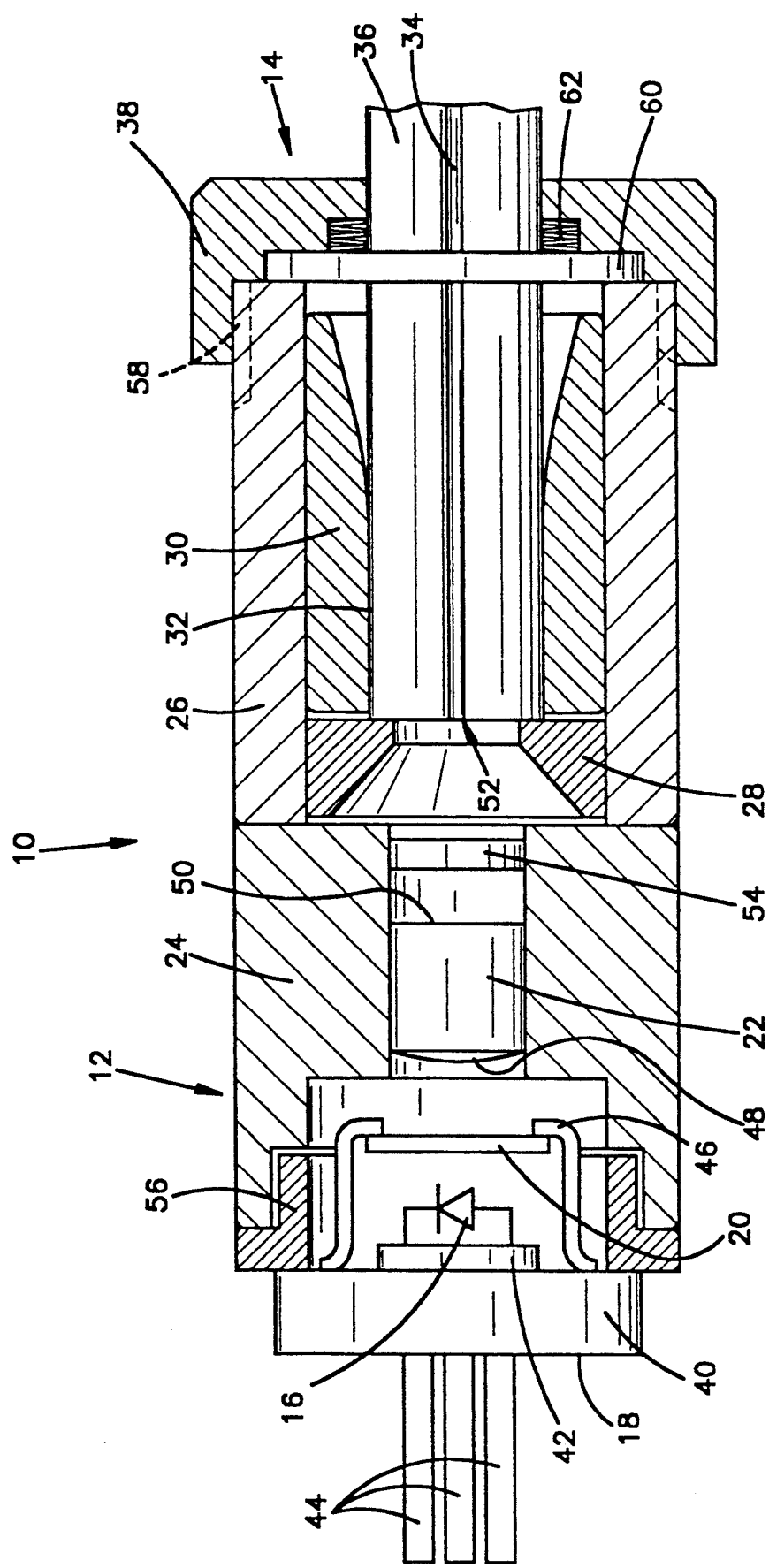
FIG. 1 is a longitudinal sectional view of the fiber optic data transmission system constructed according to the principles of the present invention.

Referring now to the drawings, FIG. 1 shows an optical data transmission system 10 constructed according to the present invention. The system comprises an optical transmitter subassembly 12 and a fiber optic cable assembly 14. The optical transmitter subassembly 12 further comprises a laser diode 16 housed in a container 18 having a window 20, and a lens 22 for focusing and attenuating the laser diode output. The laser diode 16, the container 18, and the lens 22 are all disposed within a cylindrical transmitter housing 24. The optical transmitter subassembly further comprises a cylindrical housing extension 26 which is rigidly affixed to transmitter housing 24 and which contains a cylindrical ferrule stop 28 and a cylindrical cable guide 30 having an inner bore 32. The fiber optic cable assembly 14 includes an optical fiber 34 disposed within a ferrule 36, and means for securing one end of the optical fiber 34 to the housing extension 26. In the preferred embodiment, these means comprise a threaded collar 38, and corresponding threads on the end of cylindrical housing extension 26 opposite transmitter housing 24. The threaded collar 38 is removably attachable to the cylindrical housing extension 26, thereby coupling the optical transmitter subassembly 12 to the fiber optic cable assembly 14 to complete the formation of the optical data transmission system 10.

The laser diode 16 is mounted within the container 18 to a container base 40 by means a submount 42. Wires 44 passing through the base 40 provide means to carry an electrical current from an outside power source to the laser diode 16. The container 18 is completed by a cover 46 having an aperture into which window 20 is inserted. The window 20 may be optically transparent or may be constructed of a partially light absorptive material. The window 20 permits at least a portion of the laser diode output to pass therethrough to the lens 22. Laser diode transmitters are commercially available from various manufacturers. One such transmitter is model No. LST0705-FC-A from BT&D Technologies. Commercially available transmitters may or may not include a lens for focusing the laser diode output.

The lens 22 in the preferred embodiment of the invention has a longitudinal axis and is generally cylindrical in shape about the longitudinal axis. The lens has a first end face 48 which faces the window 20 in the completed optical transmitter subassembly 12, and a second end face 50 which faces an end face 52 of the optical fiber 34 in the completed data transmission system. In the preferred embodiment of the invention, the lens 22 is used to both attenuate and focus the output from the laser diode 16. An alternative embodiment is shown by FIG. 1 wherein the lens 22 only focuses, with attenuation being provided by attenuation element 54 which may be placed in line with the longitudinal axis of the lens 22, either between window 20 and lens 22, or between lens 22 and the optical fiber end face 52. The attenuation element 54 is made of a material which is made partially light absorptive by the introduction of dopants therein. The degree of attenuation of the laser diode output can be controlled by the thickness of the attenuation element 54, the amount of dopant therein, or both.

Preferably, the lens 22 is made of a unitary piece of glass which is partially light absorptive and which is not uniform in its material properties, having a gradient refractive index induced within it by controlled variations in the material composition of the glass. The gradient refractive index permits the lens 22 to focus the laser diode output onto the end face 52 of the optical fiber 34. In the preferred embodiment of the present invention, the first end face 48 of the lens 22 is convex in shape, which enhances the focusing power of the lens.

The lens 22 in the preferred embodiment attenuates, as well as focuses, the laser diode output. The attenuating power of the lens is controlled by the amount of dopant introduced into the lens material during manufacturing of the lens. The lens becomes partially light absorptive as a result of the dopant, and is thus capable of attenuating, as well as focusing, the output of the laser diode 16. In an alternative embodiment, either or both the first and second end faces of the lens can be coated with a partially light absorptive material such as a thin plastic film to enhance the attenuating capability of the lens 22.

The attenuating lens 22 is glued or otherwise fastened within the cylindrical transmitter housing 24, the inside diameter of which is only slightly larger than the diameter of the lens 22. If the attenuation element 54 is used, it may be fastened within the transmitter housing 24 in a similar manner. The laser diode container 18 is connected to the transmitter housing 24 by means of a cylindrical collar 56, a portion of which has an outside diameter only slightly smaller than the inside diameter of a portion of the housing 24. The base 40 of container 18 can be fastened to collar 56 and collar 56 can be fastened to housing 24 by weld joint or other adhesion. Axial and radial alignment of the laser with respect to the lens is provided by the radial free play at the interface between the base 40 and the collar 56 and by radial and axial free play between the housing 24 and the collar 56.

The cylindrical housing extension 26 has a threaded end 58 and is fastened to housing 24 by weld joint or other adhesion. Radial free play at the interface between the housing 24 and the housing extension 26 permits radial alignment of the optical fiber end face 52 with respect to the lens 22. The cylindrical ferrule stop 28 has an outside diameter slightly less than the inside diameter of cylindrical housing extension 26 and can be press fitted into the inside of the extension 26. The cable guide 30, also having an outside diameter slightly less than that of the inside diameter of housing extension 26, is similarly press fitted into extension 26. The cable guide 30 has a flared opening near the threaded end 58 of the extension 26 to facilitate insertion of the optical fiber ferrule 36.

The optical fiber 34 is fastened with adhesive into the ferrule 36. A collar 60 is rigidly affixed to the ferrule. Collar 38 is loosely affixed over the ferrule and is free to turn about the ferrule axis so as to engage threads on the threaded end 58 of cylindrical housing extension 26. Spring loading means 62 provide pressure to seat the ferrule 36 against the ferrule stop 28 to position the optical fiber end face 52 at the proper axial position with respect to the lens 22.

Formation of the optical data transmission system 10 is completed by screwing the collar 38 of the fiber optic cable assembly 14 onto the threaded end of cylindrical housing extension 26 of the optical transmitter subassembly 12. Of course, other means of attaching the optical fiber 34 to the optical transmitter subassembly 12 are contemplated by the present invention, including spring loaded clips and bayonet-type twist fit connections. The optical fiber 34 thereby remains detachable from the optical transmitter subassembly 12.

Figure 2:
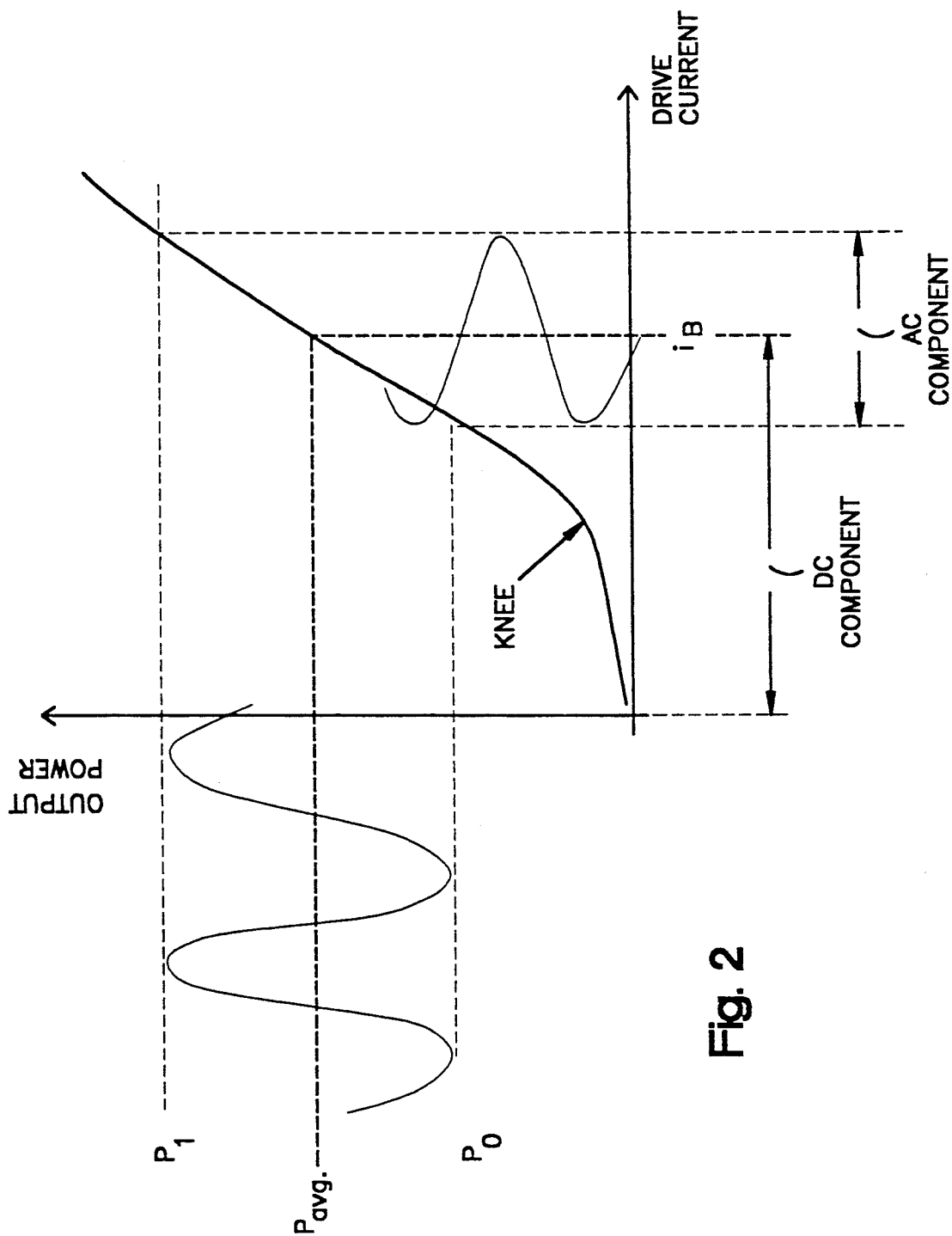
FIG. 2 is a graphical representation of the relationship between input current and output power of the laser diode of the present invention.

During the operation of the optical data transmission system 10, an external power source is used to supply the laser diode 16 with a drive current. The output power of the laser diode 16 depends on the amount of drive current supplied to the laser diode. A graphical representation of the output power versus drive current relationship is shown in FIG. 2. The graph is characterized by two distinct regions which meet at a "knee". In the first region, which extends from to zero output power to the knee, the incremental laser output power in response to an incremental drive current is relatively small. In this first region below the knee, the laser power output is non-coherent and similar to that of an LED. In the second region, which extends from the knee to a maximum drive current, the incremental laser output power in response to an incremental drive current is relatively great. In this second region above the knee, the output power varies almost linearly with the drive current over a wide region. Because the laser output is coherent in this second region, it is desirable to operate the laser above the knee and within this region.

Operating the laser diode continuously in the region above the knee requires that the laser diode drive current must always be greater than the minimum current required to reach the knee. In the present invention, a constant DC voltage is applied across the diode so that current ($i_B$) through the diode exceeds this minimum current. The optical power out of the laser when only the DC component is supplied is the average power $P_{avg}$. An AC voltage signal, containing the data to be transmitted, is superimposed over the constant DC voltage in order to obtain varied levels of laser power output. The AC component causes the laser diode output power to swing both above and below the $P_{avg}$. This method of operation results in a laser output logic level which varies from bright to dim, as opposed to an output logic level which is either on or off.

The ratio of the maximum and minimum laser output power levels, represented in FIG. 2 as $P_1$ and $P_0$, respectively, and corresponding to input driving currents of the laser diode, is called the extinction ratio. For example, a system in which $P_1$ is five times larger than $P_0$ has an extinction ratio of 5:1. Typically, $P_1$ is between three and ten times larger than $P_0$, yielding an extinction ratio of between 3:1 and 10:1. The average power corresponding to these extinction ratios is between one and five milliwatts. Average power in excess of one milliwatt can exceed established safety limits. Thus, attenuation of up to 80% of the laser diode output must be provided by the attenuating lens.

Operating the laser diode at a larger extinction ratio increases the data transmission system's signal-to noise-ratio, thereby decreasing the bit error rate associated with data transmission. Hence, it is preferable to operate the laser diode at these higher extinction ratios. However, the extinction ratio cannot be increased to a level which renders the laser diode operative at an unsafe level. In the preferred embodiment of the present invention, the laser diode can be operated at higher than normal drive currents due to the presence of the attenuating lens. The attenuating lens absorbs the additional power generated by the laser diode when the drive current is increased, thereby limiting the net output power to prescribed safety limits.

The amplitude of the input drive current to the laser diode is modulated between two distinct input levels in order to vary the magnitude of the output power of the laser diode between the two corresponding distinct output levels, $P_0$ and $P_1$. The output power levels $P_0$ and $P_1$ are selected to limit the resulting bit error rate of the data transmission system to a value above which the bit error rate is unacceptable. The increased laser diode output is then attenuated to a safe operating level by the lens.

Figure 3:
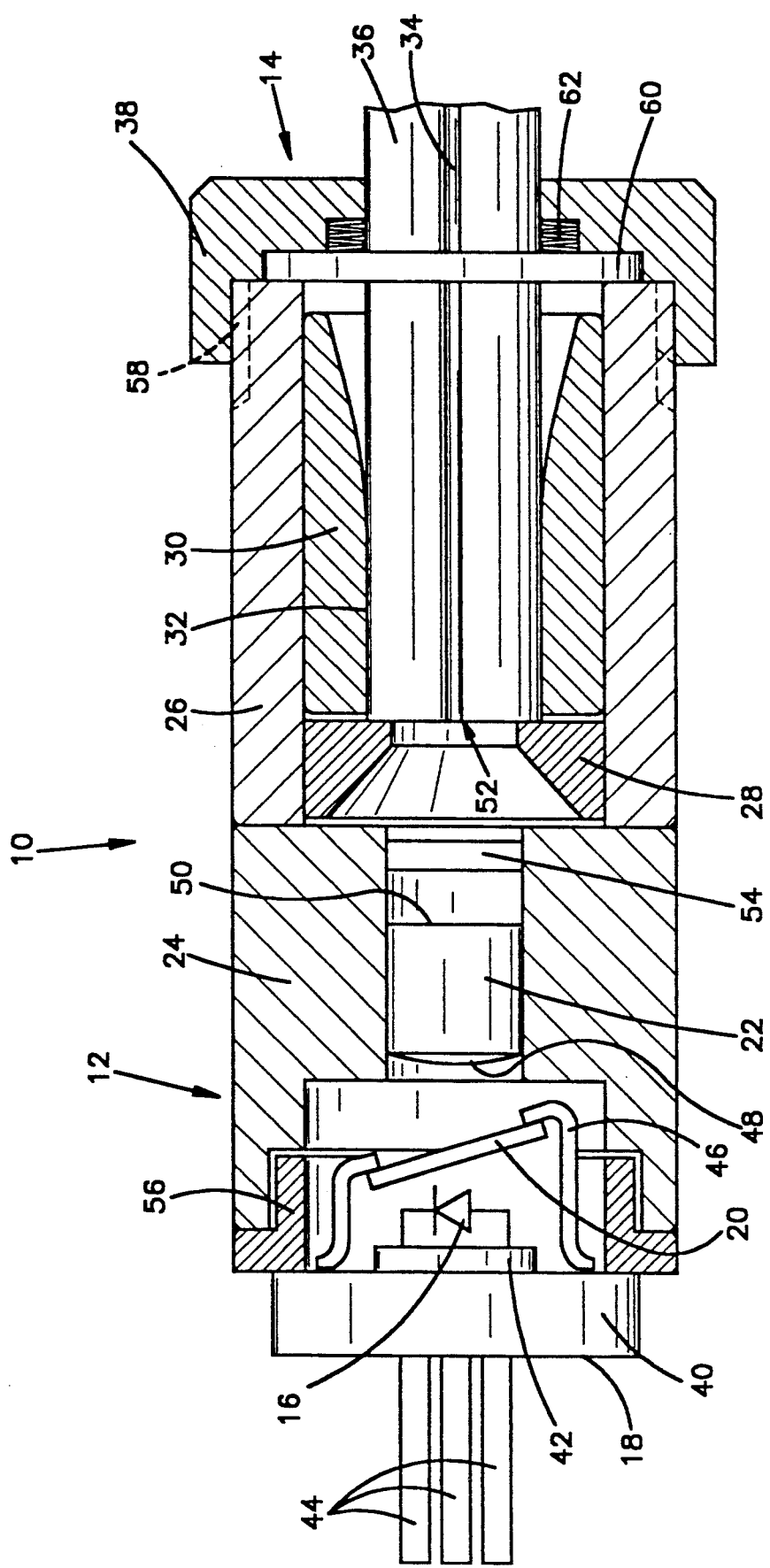
FIG. 3 is a longitudinal sectional view of another embodiment of the present invention.

FIG. 3 shows another embodiment of the present invention. In this embodiment, the window 20 is made of a partially light reflective material. The reflective material augments the operation of the lens 22, further restricting the amount of laser output which is transmitted along the optical fiber 34, by reflecting a portion of the output back toward the laser diode. To prevent laser diode back reflection from interfering with laser diode operation, the window 20 is disposed at an angle which is not perpendicular to the longitudinal axis of the lens 22. Any portion of the laser diode output which does not pass through the lens 22 is prevented from reflecting directly back toward the laser diode 16. In an alternative embodiment, the window 20 is not made of a partially light reflective material, but is instead made of a transparent material coated with a partially light reflective coating, such as a plastic film.

As a practical matter, a partially light reflective material, or a material having a partially light reflective coating, could be placed along the longitudinal axis of the lens 22 at any position between the laser diode 16 and optical fiber end face 52. An element comprised of such a material should be positioned at an angle which is not perpendicular to the longitudinal axis of the lens so as to prevent reflection of light back toward the laser diode.

Accordingly, a fiber optic data transmission system has been described which reduces laser diode output noise and the bit error rate experienced during data transmission. Further, a method of operating the data transmission system has been described which increases the extinction ratio of the laser diode while attenuating the resulting increased output power of the laser diode. Such a method of operating a laser diode transmitter in a fiber optic data transmission system increases the system's signal-to-noise ratio. It is to be understood that the above concepts are applicable to analog transmission systems as well, in order to improve the signal to noise ratio in such systems. With the present the disclosure in mind, however, it is believed that obvious alternatives to the preferred embodiment, to achieve comparable advantages in other optical data transmission systems, will become apparent to those of ordinary skill in the art.

What is claimed is:

1. An optical data transmission system, comprising:
   a light emitting device having a drive current input and an optical signal output the power of which varies generally linearly with changes in said drive current input;
   a single focusing and attenuating element for focusing said optical signal output of said light emitting device and for attenuating said optical signal output by absorbing a substantial portion thereof; and
   a fiber optic cable having an endface for receiving is a attenuated and focused optical signal output and a generally uniform cross sectional area throughout its length for transmitting said attenuated and focused optical signal output.

2. The apparatus of claim 1, wherein:
   said light emitting device comprises a laser diode having a substantially coherent optical signal output.

3. The apparatus of claim 2, wherein said single focusing and attenuating element comprises a lens having a gradient refractive index along a longitudinal axis for focusing said laser diode output, a first end face facing said laser diode, and a second end face facing said end face of said optical fiber.

4. The apparatus of claim 3, wherein said first end face of said lens is convex in shape.

5. The apparatus of claim 3, wherein at least one of said first and second end faces of said lens is coated with a partially light absorptive material.

6. The apparatus of claim 5, wherein said light emitting device is disposed within a container having a window, said window located intermediate said laser diode and said first 7. The apparatus of claim 3, wherein dopants introduced into a material from which said lens is constructed absorb said laser diode output, the level of attenuation provided by said lens being dependent upon the amount of dopant therein.

8. The apparatus of claim 5, wherein said window is substantially planar, said window disposed perpendicular to said longitudinal axis of said lens.

9. The apparatus of claim 5, wherein said window is comprised of a material which is partially light absorptive.

10. The apparatus of claim 5, wherein said window is comprised of material which is partially light reflective.

11. The apparatus of claim 5, wherein said partially light reflective window is substantially planar, said window disposed in a plane which is not perpendicular to said longitudinal axis of said lens.

12. An optical data transmitter, comprising:
   a laser diode having a drive current input and an optical signal output the power of which changes generally linearly with changes in said drive current input to said laser diode; and
   a single focusing and attenuating element for focusing said optical signal output by said laser diode and for attenuating said optical signal by absorbing a substantial portion thereof.

13. The apparatus of claim 12, wherein said single focusing and attenuating element comprises a lens having a gradient refractive index along a longitudinal axis for focusing said laser diode output, and further having a first end face facing toward said laser diode and a second end face facing away from said laser diode.

14. The apparatus of claim 13, wherein dopants introduced into a material from which said lens is constructed absorb said laser diode output, the level of attenuation provided by said lens being dependent upon the amount of dopant therein.

15. The apparatus of claim 13, wherein said first end face of said lens is convex in shape.

16. The apparatus of claim 14, wherein at least one of said first and second end faces is coated with a light absorptive material.

17. A method of operating laser diode transmitter in an optical data transmission system to increase the signal to noise ratio of the system, comprising the steps of:
   applying sufficient input drive current to said laser diode transmitter so that the output power of the diode changes generally linearly with changes in said input drive current;
   modulating the amplitude of said input drive current to said laser diode transmitter between two distinct input levels to vary the magnitude of the output power of said laser diode between two corresponding distinct output levels;
   selecting a minimum and maximum level of power to be outputted by said system corresponding to said distinct output levels of said laser diode transmitter; and
   attenuating said laser diode transmitter distinct output levels to said selected corresponding minimum and maximum levels of system power output using a focusing lens having dopants therein for absorbing a substantial portion of said laser diode output, the level of attenuation provided by said lens being dependent upon the amount of dopant therein.

18. The method of claim 17, wherein:
   said input drive current to said laser diode transmitter comprises a steady state DC component and an AC component superimposed upon said DC component.

19. The apparatus of claim 18, wherein said lens has a gradient refractive index along a longitudinal axis thereof.

20. The method of claim 19, wherein at least a portion of an external surface of said lens is coated with partially light absorptive material.

* * * * *